(12) United States Patent
Okura

(10) Patent No.: US 10,663,343 B2
(45) Date of Patent: May 26, 2020

(54) OPTICAL SENSOR FOR A DIRECTIVITY CHARACTERISTIC CALCULATION OF RECEIVED LIGHT ON THE BASIS OF A DEVIATION OF A DETECTED INTENSITY DISTRIBUTION FROM A REFERENCED INTENSITY DISTRIBUTION

(71) Applicant: DENSO CORPORATION, Kariya, Aichi-pref. (JP)

(72) Inventor: Takamitsu Okura, Kariya (JP)

(73) Assignee: DENSO CORPORATION, Kariya (JP)

( * ) Notice: Subject to any disclaimer, the term of this patent is extended or adjusted under 35 U.S.C. 154(b) by 82 days.

(21) Appl. No.: 16/087,671

(22) PCT Filed: May 22, 2017

(86) PCT No.: PCT/JP2017/018959
§ 371 (c)(1),
(2) Date: Sep. 24, 2018

(87) PCT Pub. No.: WO2018/003343
PCT Pub. Date: Jan. 4, 2018

(65) Prior Publication Data
US 2019/0101441 A1    Apr. 4, 2019

(30) Foreign Application Priority Data

Jun. 28, 2016  (JP) .................................. 2016-127869

(51) Int. Cl.
*G01J 1/42* (2006.01)
*G01J 1/06* (2006.01)
(Continued)

(52) U.S. Cl.
CPC . *G01J 1/42* (2013.01); *G01J 1/02* (2013.01); *G01J 1/06* (2013.01); *H01L 31/02164* (2013.01); *H01L 31/167* (2013.01)

(58) Field of Classification Search
CPC ......... G01J 1/06; G01J 1/42; H01L 31/02164; H01L 31/167
(Continued)

(56) References Cited

U.S. PATENT DOCUMENTS 8,654,266 B2 * 2/2014 Katoh .................. G01J 1/06
349/12
2013/0037700 A1   2/2013 Michiyama et al.
2015/0221786 A1   8/2015 Michiyama

FOREIGN PATENT DOCUMENTS

JP        2005-249478 A    9/2005

* cited by examiner

*Primary Examiner* — Que Tan Le
(74) *Attorney, Agent, or Firm* — Posz Law Group, PLC

(57) ABSTRACT

A detection unit includes multiple detection elements, which are configured to output intensities of received light as detection signals, and a light shielding portion, which is configured to regulate an incident angle of light with respect to the detection elements. The storage unit is configured to store a reference distribution indicating a distribution of intensity of light detected with the detection units caused by irradiation of reference light having a reference directivity characteristic on the detection unit. The calculation unit is configured to input the detection signals from the detection elements, to calculate the detection distribution of the intensity of received light, to input the reference distribution from the storage unit, to calculate a deviation of the detection distribution from the reference distribution, and to calculate a directivity characteristic of received light on the basis of the deviation.

4 Claims, 4 Drawing Sheets

(51) Int. Cl.
*G01J 1/02* (2006.01)
*H01L 31/0216* (2014.01)
*H01L 31/167* (2006.01)

(58) Field of Classification Search
USPC .................................. 250/205, 203.4, 221
See application file for complete search history.

FIG. 6

| | | (a6) 120 | | |
|---|---|---|---|---|
| | | (a7) 108 | | |
| (a5) 30 | (a4) 36 | (a3) 60 | (a2) 36 | (a1) 30 |
| | | (a8) 24 | | |
| | | (a9) 24 | | |

FIG. 7

| | | (a6) 100 | | |
|---|---|---|---|---|
| | | (a7) 90 | | |
| (a5) 25 | (a4) 30 | (a3) 50 | (a2) 30 | (a1) 25 |
| | | (a8) 20 | | |
| | | (a9) 20 | | |

FIG. 8

| | | (b6) 200 | | |
|---|---|---|---|---|
| | | (b7) 250 | | |
| (b5) 150 | (b4) 200 | (b3) 350 | (b2) 250 | (b1) 150 |
| | | (b8) 150 | | |
| | | (b9) 100 | | |

OPTICAL SENSOR FOR A DIRECTIVITY CHARACTERISTIC CALCULATION OF RECEIVED LIGHT ON THE BASIS OF A DEVIATION OF A DETECTED INTENSITY DISTRIBUTION FROM A REFERENCED INTENSITY DISTRIBUTION

CROSS REFERENCE TO RELATED APPLICATION

This application is a U.S. national phase of International Application No. PCT/JP2017/018959 filed on May 22, 2017 and is based on Japanese Patent Application No. 2016-127869 filed on Jun. 28, 2016, the disclosures of which are incorporated herein by reference.

TECHNICAL FIELD

The present disclosure relates to an optical sensor.

BACKGROUND ART

Conventionally, for example, Patent Document 1 proposes an optical sensor device including multiple first light receiving elements and a singular second light receiving element having a light receiving area larger than that of each of the first light receiving elements. The multiple first light receiving elements are arranged around the second light receiving element and are different from each other in elevation angle of light to be detected. The second light receiving elements are configured to receive light incident from various directions.

The optical sensor device compares intensities of output signals from the first light receiving elements. In this way, the optical sensor device specifies the first light receiving element, which outputs the most intense output signal, and specifies the angle of the light incident on the light receiving surface of the first light receiving element as specified. In addition, the optical sensor device calculates an irradiance level of light based on the output signals of the second light receiving elements. In this way, the optical sensor device is configured to figure out a directivity characteristics of incident light.

However, in the above-described conventional technique, the light detected with the second light receiving elements includes not only light in one direction specified from the output signals of the respective first light receiving elements but also light at various angles. For this reason, the irradiance levels of light detected with the second light receiving elements depend on the irradiance level at an arbitrary angle. Therefore, there is a concern that a detection accuracy of the directional characteristic may be insufficient.

PRIOR TECHNICAL LITERATURE

Patent Literature

PATENT LITERATURE 1: JP 2012-103126 A

SUMMARY OF INVENTION

It is an object of the present disclosure to provide a optical sensor capable of ensuring the detection accuracy of the directional characteristics.

According to one aspect of the present disclosure, an optical sensor comprises a detection unit including a plurality of detection elements, which are configured to output intensities of received light as detection signals, and a light shielding portion, which is configured to regulate an incident angle of light with respect to the detection elements. The optical sensor further comprises a storage unit configured to store a reference distribution indicating a distribution of an intensity of light detected with the detection unit caused by irradiation of reference light having a reference directivity characteristic on the detection unit. The optical sensor further comprises a calculation unit configured to input the detection signal from the detection elements, to calculate a detection distribution of intensity of the received light, to input the reference distribution from the storage unit, to calculate a deviation of the detection distribution from the reference distribution, and to calculate a directivity characteristic of the received light on the basis of the deviation.

BRIEF DESCRIPTION OF THE DRAWINGS

The above and other objects, features and advantages of the present disclosure will become more apparent from the following detailed description made with reference to the accompanying drawings. In the drawings:

FIG. 6 is a view showing an example of a reference distribution of an elevation angle A;

FIG. 7 is a view showing a ratio value of the reference distribution shown in FIG. 6; and FIG. 8 is a view showing an example of a reference distribution of the elevation angle A.

DESCRIPTION OF EMBODIMENTS

Figure 1:
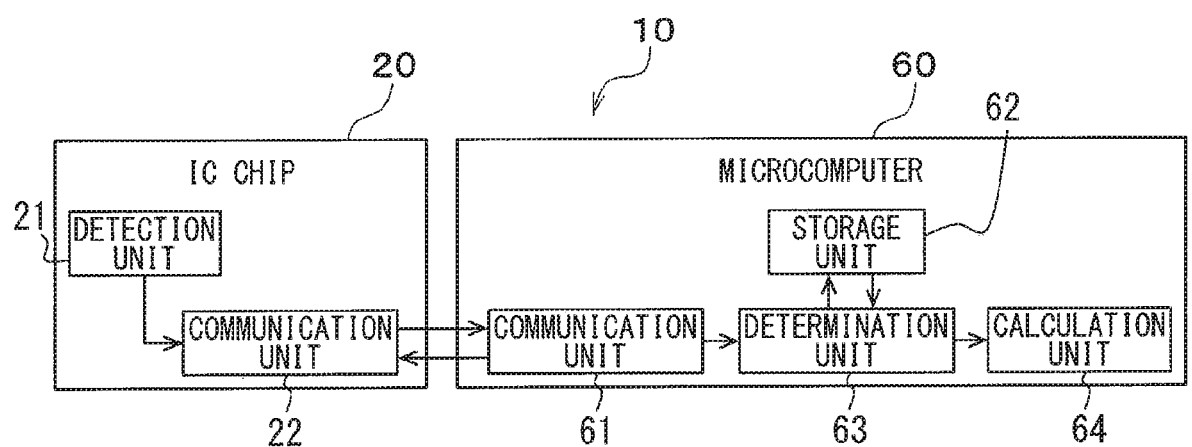
FIG. 1 is a diagram illustrating an optical sensor according to a first embodiment of the present disclosure.

Hereinafter, embodiments of the present disclosure will be described with reference to the drawings. In the following embodiments, identical or equivalent elements are denoted by the same reference numerals as each other in the figures.

First Embodiment

Hereinafter, a first embodiment of the present disclosure will be described with reference to the drawings. The optical sensor according to the present embodiment is mounted on a vehicle and is used for, for example, detecting light from the exterior of the vehicle and incident on the vehicle. As shown in FIG. 1, the optical sensor 10 includes an IC chip 20 and a microcomputer 60 (hereinafter referred to as microcomputer 60).

Figure 2:
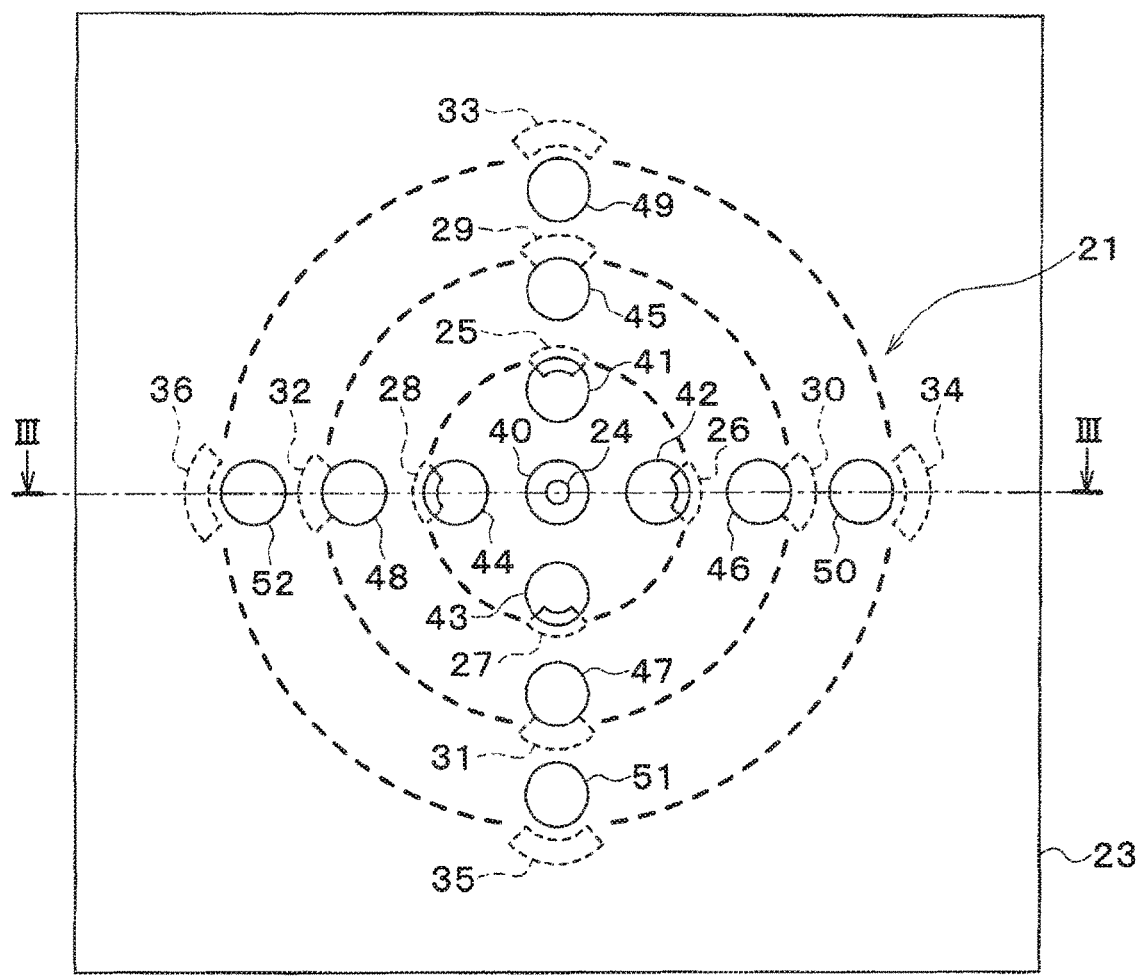
FIG. 2 is a plan view showing an IC chip.
Figure 3:
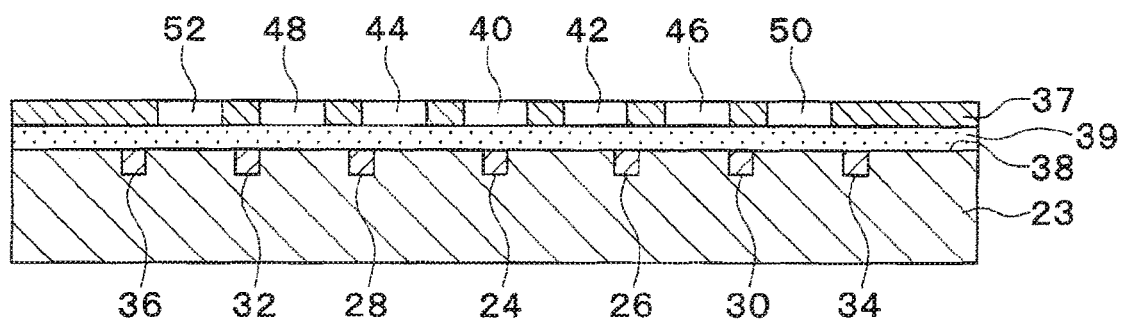
FIG. 3 is a cross-sectional view taken along the line Ill-III in FIG. 3.

The IC chip 20 includes a detection unit 21 and a communication unit 22. The detection unit 21 forms a sensing unit for detecting light. As shown in FIGS. 2 and 3, the detection unit 21 includes a semiconductor substrate 23, multiple detection elements 24 to 36, and a light shielding portion 37.

The multiple detecting elements 24 to 36 are light receiving elements for detecting light. Specifically, each of the detection elements 24 to 36 is a photodiode configured to detect the intensity of the received light. For example, the photodiode is manufactured by forming a P-type ion implantation region on one surface 38 of the N-type semiconductor substrate 23.

Each of the detection elements 24 to 36 is connected to an anode electrode (not shown). The semiconductor substrate 23 is connected to a cathode electrode (not shown). In the configuration, each of the detection elements 24 to 36 detects the intensity of the received light as a voltage between the anode and the cathode and outputs the detected voltage as a detection signal. In the present embodiment, twelve detection elements 25 to 36 are arranged in a cross shape to center one detection element 24.

Figure 4:
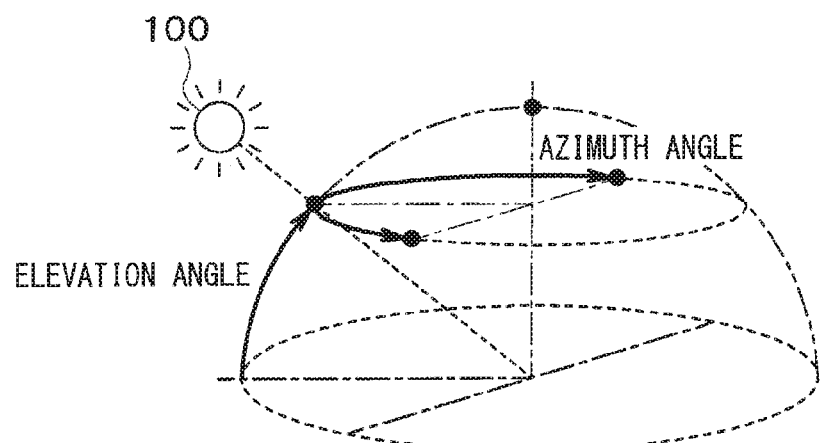
FIG. 4 is a view showing an elevation angle and an azimuth angle.

The light shielding portion 37 defines an incident angle of light to each of the detection elements 24 to 36. In other words, the light shielding portion 37 defines an elevation angle characteristics for each of the detection elements 24 to 36 so that the intensities of the light received from a specific direction are different from each other. As shown in FIG. 4, the elevation angle is the angle in the vertical direction with respect to a reference plane, which is one surface 38 of the semiconductor substrate 23. The azimuth angle is the angle from a reference direction in the reference surface.

The light shielding portion 37 is formed of, for example, a metal film such as Al or CrSi. The light shielding portion 37 is formed on an interlayer film 39 formed on the one surface 38 of the semiconductor substrate 23. The interlayer film 39 is, for example, a translucent BPSG film.

As shown in FIG. 2, the light shielding portion 37 has through holes 40 to 52 corresponding to the respective detection elements 24 to 36. Among the through holes 40 to 52, the through hole 40 corresponds to the detection element 24, which is located at the center among the detection elements 24 to 36 arranged in the cross shape. The through hole 40 is located right above the detection element 24. In the configuration, the detection element 24 selectively receives light irradiated at an angle of 90° in a direction perpendicular to the one surface 38 of the semiconductor substrate 23. That is, the detecting element 24 selectively receives light at an elevation angle of 90° with respect to the one surface 38 of the semiconductor substrate 23. FIG. 2 shows only the through holes 40 to 52 of the light shielding portion 37.

Each of the through holes 41 to 44 selectively leads light, which is at an elevation angle less than 90° with respect to the one surface 38 of the semiconductor substrate 23 and is irradiated to the four detection elements 25 to 28 positioned outside the detection element 24. Each of the through holes 45 to 48 selectively lead light, which is at an angle smaller than the elevation angle with respect to the four detection elements 25 to 28 and is irradiated to the four detection elements 29 to 32 positioned outside the four detection elements 25 to 28. Furthermore, each of the through holes 49 to 52 selectively lead light, which is at an angle smaller than the elevation angle with respect to the four detection elements 29 to 32 and is irradiated to the four detection elements 33 to 36 positioned outside the four detection elements 29 to 32.

In the present configuration, the detection elements 24 to 36 are enabled to selectively receive light at respective predetermined elevation angles with respect to the one surface 38 of the semiconductor substrate 23. The through holes 40 to 52 are formed in the light shielding portion 37 in the above-described way, thereby the detection elements 24 to 36 are configured to receive light in directions different from each other.

The communication unit 22 shown in FIG. 1 is a circuit unit that outputs the detection signals of the detection elements 24 to 36, which are output from the detection unit 21, to the microcomputer 60. The communication unit 22 is formed on the semiconductor substrate 23.

The microcomputer 60 is a computing device that inputs the detection signals from the detection unit 21 via the communication unit 22 of the IC chip 20 and performs signal processing on the detection signals. As shown in FIG. 1, the microcomputer 60 includes a communication unit 61, a storage unit 62, a determination unit 63, and a computation unit 64.

The communication unit 61 is a circuit unit to enable the microcomputer 60 to communicate with the IC chip 20. The communication unit 61 outputs a command signal requesting the detection signals to the communication unit 22 of the IC chip 20. Further, the communication unit 61 outputs the detection signals sent from the IC chip 20 to the determination unit 63.

The storage unit 62 stores data such as program for signal processing, a reference distribution, a correction coefficient, and the like. In other words, the storage unit 62 is a memory. The reference distribution is a distribution of the intensities of light, which is irradiated as reference light having the reference directional characteristic on the detecting unit 21 and is detected with the detecting unit 21. The correction coefficient is a parameter for removing unnecessary light, which is included in the reference distribution, according to the direction of incidence of light to the detection unit 21.

The determination unit 63 has a function to input the detection signals from the communication unit 61 to acquire the detection distribution of the intensities of light received with the detection unit 21, a function to grasp the incident direction of light based on the detection distribution, and a function to input the correction coefficient corresponding to the incident direction from the storage unit 62. The detection distribution is a distribution of the intensities of light actually detected with the detection elements 24 to 36. The determination unit 63 further has a function to acquire the reference distribution from the storage unit 62.

The calculation unit 64 inputs the reference distribution, the correction coefficient, and the detection distribution from the determination unit 63 and calculates the directivity characteristic of light received with the detection unit 21 by using these figures. The directional characteristic is a characteristic that indicates correlation between the direction in which the light is incident to the detection unit 21 and the irradiance level.

The IC chip 20 and the microcomputer 60 are mounted on a circuit board (not shown). On the circuit board, electronic parts other than the IC chip 20 and the microcomputer 60 are also mounted. The optical sensor 10 is provided with a housing for accommodating the circuit board, a terminal for electrical connection with other devices, and the like. The configuration of the optical sensor 10 has been described as above.

Subsequently, a method of acquiring the reference distribution will be described. The reference distribution is stored in the storage unit 62 when the optical sensor 10 is manufactured. Data of the reference distribution has been acquired in advance by conducting measurement.

Figure 5:
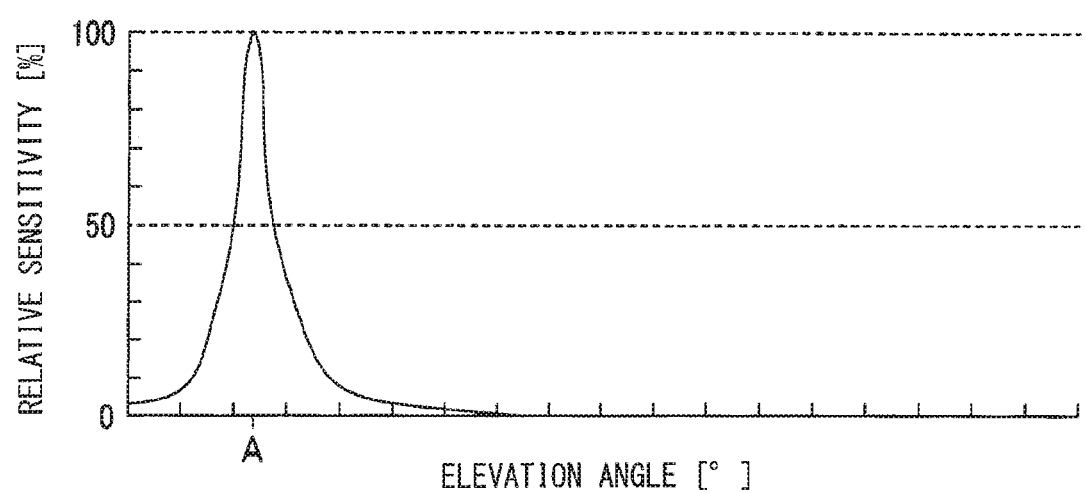
FIG. 5 is a view showing a directivity characteristic as a reference.

The reference distribution is measured in the following way. First, as shown in FIG. 4, a reference light source 100 is provided for emitting the reference light. The detection unit 21 is arranged with respect to the reference light source 100 so that light having the reference directivity characteristic is to be incident on the detection unit 21. That is, the direction and the inclination angle of the one surface 38 of the semiconductor substrate 23 are fixed with respect to the irradiation direction of the reference light. In this way, the elevation angle is adjusted. For example, as shown in FIG. 5, the reference directivity characteristic exhibits the highest relative sensitivity on light incident at an elevation angle A to the detection unit 21.

Thereafter, the reference light is emitted from the reference light source 100. In addition, a measurement device for measuring the reference distribution is used to acquire the intensities of light detected with the respective detection elements 24 to 36 of the detection unit 21. The distribution of the intensities of the light is the reference distribution.

For example, the reference distribution of the reference directional characteristic at the elevation angle A is shown in FIG. 6. In FIG. 6, (a1) corresponds to the detection value of the detection element 30, (a2) corresponds to the detection value of the detection element 26, (a3) corresponds to the detection value of the detection element 24, (a4) corresponds to the detection value of the detection element 28, (a5) corresponds to the detection value of the detection element 32, (a6) corresponds to the detection value of the detection element 29, (A7) corresponds to the detection element 25, (a8) corresponds to the detection element 27, and (a9) corresponds to the detection value of the detection element 31. In the reference directivity characteristic at the elevation angle A, the value of (a6) is highest.

As shown in FIG. 7, ratio values of other values are calculated to the value of (a6) as a reference having the largest figure in FIG. 6. Data of the reference distribution shown in FIG. 7 is stored in the storage unit 62 of the microcomputer 60. The data of the reference distribution may employ either the measurement value or the ratio value. In the present embodiment, the ratio values in FIG. 7 are stored in the storage unit 62 during a manufacturing process of the optical sensor 10.

Subsequently, a method for acquiring the correction coefficient will be described. As shown in FIG. 5, the relative sensitivity of light is the highest at the elevation angle A. Even through, light at an angle other than the elevation angle A is also incident on the detection unit 21. Such light is unnecessary for detection.

Unnecessary light is light such as diffused light contained in natural light. A rate of incidence of unnecessary light varies depending on the irradiation angle and the irradiation range with respect to the detection unit 21. The correction coefficient is a ratio for removing the unnecessary light, which is from the reference distribution, according to the irradiation angle and the irradiation range with respect to the detection unit 21.

In order to acquire the correction coefficient, various light at different irradiation angles and in different irradiation ranges are irradiated on the detection unit 21. In this way, the ratio, at which the unnecessary light is included in the detection value acquired with the detection unit 21, is calculated. For example, when light is incident in a predetermined range of the detection unit 21 shown in FIG. 2 from the upper right side in the drawing, the ratio of unnecessary light included in the reference distribution is calculated as a percentage.

Correction coefficient is set with respect to the value corresponding to 100% in the reference distribution shown in FIG. 7. Further, the data of the correction coefficient is mapped with the irradiation angle and the irradiation range with respect to the detection unit 21. Subsequently, the mapped correction coefficient is stored in the storage unit 62 during the manufacturing process of the optical sensor 10.

Subsequently, an operation of the optical sensor will be described. First, the detection unit 21 detects distribution of light. For example, as shown in FIG. 8, values of (b1) to (b9) are detected. It is noted that, (b1) to (b9) in FIG. 8 correspond to (a1) to (a9) in FIG. 2, respectively.

The determination unit 63 calculates the detection distribution of the light intensities based on the detection signals input from the detection elements 24 to 36 of the detection unit 21 via the communication units 22 and 61. Further, the determination unit 63 roughly grasps the incident direction of light to the detection unit 21 based on the detection distribution.

Further, the determination unit 63 calculates the correction coefficient, which corresponds to the incident direction of the grasped light, from the storage unit 62. Furthermore, the determination unit 63 acquires the reference distribution from the storage unit 62. Subsequently, the determination unit 63 outputs the reference distribution, the correction coefficient, and the detection distribution to the calculation unit 64.

After correcting the reference distribution by using the correction coefficient, the calculation unit 64 calculates a deviation of the detection distribution from the corrected reference distribution. First, the calculation unit 64 corrects the reference distribution by using the correction coefficient. For example, (a6) in the reference distribution shown in FIG. 2 is noted. As described above, (a6) is set to 100%. In FIG. 8, the measurement value of (b6) corresponding to (a6) is 200.

It is noted that, unnecessary light is counted in the actually measured value of "200." Therefore, "200" does not necessarily correspond to "100%" in the reference distribution. Therefore, the calculation unit 64 corrects "100%" by using the correction coefficient. In other words, the calculation unit 64 calculates the amount of "200" with respect to 100%. Assuming that the correction coefficient is B, the value after the correction is 200×B. As a result, the unnecessary light contained in "200" is removed by using the correction coefficient. Thus, 200×B becomes 100% of (a6) after the correction.

Similarly, values other than (a6) shown in FIG. 7 are also corrected. For example, (a7) is 200×B×0.90, and (a3) is 200×B×0.50.

Subsequently, the calculation unit 64 computes the deviation of the detection distribution to the corrected reference distribution. Specifically, the deviation is computed to extract a proportion corresponding to the reference distribution from the detection distribution shown in FIG. 8 and to further remove unnecessary light. In other words, it is to remove light other than the reference distribution from the detection distribution.

The calculation unit 64 calculates a product by multiplying the actual measurement value shown in FIG. 8 by the value of the corrected reference distribution. For example, (a6) is 200×B×1.00×200, and (a7) is 200×B×0.90×250. The calculation unit 64 calculates all the values in the detection distribution. Further, the calculation unit 64 takes the sum of the values after the calculation. This sum is the illuminance of light. In this way, the calculation unit 64 calculates the directivity characteristics of the received light based on the deviation between the reference distribution and the detection distribution.

It is to be noted that the calculation unit 64 specifies the incident direction of light based on the detection distribution. In this way, the calculation unit 64 is enabled to acquire both the light incidence direction and the illuminance information.

As described above, in the present embodiment, the calculation unit 64 calculates the deviation between the reference distribution and the detection distribution. That is, the calculation unit 64 performs the calculation to remove unnecessary light contained in the detection distribution. Therefore, the present configuration enables to accurately extract the proportion of the reference distribution from the detection distribution containing light in various directions. Thus, the configuration enables to secure the detection accuracy of the directivity characteristic of light received with the detection unit 21.

Further, in the present embodiment, the reference distribution is corrected by using the correction coefficient. Therefore, unnecessary light contained in the detection distribution can be reliably excluded. Thus, the detection accuracy of the directivity characteristic can be enhanced.

The determination unit 63 and the calculation unit 64 correspond to a calculation unit.

Second Embodiment

In the present embodiment, configurations different from those of the first embodiment will be described. In the present embodiment, the storage unit 62 stores multiple reference distributions for respective reference lights having multiple reference directional characteristics respectively. For example, in addition to the reference distribution corresponding to the reference directivity characteristic at the elevation angle A, the storage unit 62 stores the reference distribution corresponding to the reference directivity characteristic at another elevation angle. In addition, the storage unit 62 stores correction coefficients for removing unnecessary light contained in the reference distribution for respective reference distributions correspondingly to the directions of incidence of light to the detection unit 21.

In response to a request from the external device, the determination unit 63 inputs from the storage unit 62 the reference distribution corresponding to the directional characteristic to be detected by the detection unit 21 among the multiple reference distributions and inputs the correction coefficient corresponding to the reference distribution. After correcting the reference distribution by using the correction coefficient, the calculation unit 64 calculates the deviation. In this way, the optical sensor 10 is enabled for multiple applications.

Third Embodiment

In the present embodiment, configurations different from those of the first and second embodiments will be described. In the above-described embodiments, the calculation unit 64 has the function to correct the reference distribution by using the correction coefficient. To the contrary, in the present embodiment, the correction coefficient is not stored in the storage unit 62. Therefore, the determination unit 63 has a function to input a detection signal via the communication units 22 and 61 and to acquire a detection distribution of the intensity of light received with the detection unit 21. The determination unit 63 further has a function to acquire the reference distribution from the storage unit 62.

The calculation unit 64 inputs the reference distribution and the detection distribution from the determination unit 63, calculates the deviation of the detection distribution from the reference distribution, and obtains the directivity characteristic of the received light based on the deviation. In this way, the directional characteristic may be acquired by extracting the proportion of the reference distribution from the detection distribution without using the correction coefficient.

As a modification, the optical sensor 10 may not include the determination unit 63, since it is unnecessary to grasp the direction of incidence of light and to read out the correction coefficient by using the determination unit 63. That is, the calculating unit 64 may have the function to calculate the detection distribution and the reference distribution.

Fourth Embodiment

In the present embodiment, configurations different from those of the third embodiment will be described. In the present embodiment, the storage unit 62 stores multiple reference distributions for respective reference lights having multiple reference directional characteristics respectively. For example, in addition to the reference distribution corresponding to the reference directivity characteristic at the elevation angle A, the storage unit 62 stores the reference distribution corresponding to the reference directivity characteristic at another elevation angle.

In response to a request from the external device, the determination unit 63 inputs from the storage unit 62 the reference distribution corresponding to the directional characteristic to be detected by the detection unit 21 among the multiple reference distributions. The calculation unit 64 calculates the deviation by using the reference distribution input from the determination unit 63 In this way, the optical sensor 10 is enabled for multiple applications.

Other Embodiments

The configurations of the optical sensor 10 described in the above embodiments is an example of the present disclosure. The optical sensor 10 is not limited to employ the above-described configurations and may employ another configuration embodying the present disclosure. For example, in the first and second embodiments, the determination unit 63 and the calculation unit 64 may be integrated.

The number and the arrangement of the detection elements 24 to 36 shown in FIG. 2 are mere examples, and another number and another arrangement may be employable. The illuminance distribution is to be grasped. Therefore, the arrangement of the detection elements 24 to 36 is not limited to be in the symmetric cross shape. For example, the cross-shaped detection elements 24 to 36 shown in FIG. 2 may be rotated by 45 degrees clockwise or counterclockwise about the detection element 24 as the center. The rotation angle of 45 degrees is an example. Arrangement of the detection elements 24 to 36 may be appropriately determined according to the number and the size of the detection elements 24 to 36.

The above-described optical sensor includes the detection unit 21 including the multiple detection elements 24 to 36, which outputs the intensity of the received light as a detection signal, and the light shielding portion 37, which regulates the incident angle of light to the multiple detection elements. The optical sensor further includes the storage unit 62, which stores the reference distribution indicating the distribution of the intensity of light detected with the detection unit when the reference light having the reference directivity characteristic is irradiated on the detection unit. The optical sensor further includes the calculation unit 63 and 64, which is to input the detection signal from the multiple detection elements, to calculate the detection distribution of the intensity of received light, to input the reference distribution from the storage unit, to calculate the deviation of the detection distribution from the reference distribution, and to calculate the directivity characteristic of received light on the basis of the deviation.

According to this, the calculation unit calculates the deviation between the reference distribution and the detection distribution. Therefore, the proportion of the reference distribution contained in the detection distribution can be extracted. That is, unnecessary light included in the detection distribution can be removed. Thus, the detection accuracy of the directivity characteristic can be secured.

While the present disclosure has been described with reference to the embodiments thereof, it is to be understood that the disclosure is not limited to the embodiments and constructions. The present disclosure is intended to cover various modification and equivalents. Furthermore, various combination and formation, and other combination and formation including one, more than one or less than one element may be made in the present disclosure.

The invention claimed is:

1. An optical sensor comprising:
a detection unit including a plurality of detection elements, which are configured to output intensities of received light as detection signals, and a light shielding portion, which is configured to regulate an incident angle of light with respect to the detection elements;
a storage unit configured to store a reference distribution indicating a distribution of an intensity of light detected with the detection unit caused by irradiation of reference light having a reference directivity characteristic on the detection unit; and
a calculation unit configured to input the detection signal from the detection elements, to calculate a detection distribution of intensity of the received light, to input the reference distribution from the storage unit, to calculate a deviation of the detection distribution from the reference distribution, and to calculate a directivity characteristic of the received light on the basis of the deviation.

2. The optical sensor according to claim 1, wherein
the storage unit is configured to store a correction coefficient for removing unnecessary light contained in the reference distribution correspondingly to a direction of incidence of light to the detection unit, and
the calculation unit is configured to grasp the incident direction based on the detection distribution, to input from the storage unit the correction coefficient corresponding to the incident direction, to correct the reference distribution by using the correction coefficient, and subsequently to correct the deviation.

3. The optical sensor according to claim 1, wherein
the storage unit is configured to store a plurality of reference distributions for respective reference lights having respective reference directional characteristics, and
the calculation unit is configured to input from the storage unit a reference distribution, which corresponds to a directional characteristic to be detected with the detection unit, among the reference distributions and to calculate the distribution.

4. The optical sensor according to claim 1, wherein
the storage unit is configured to store a plurality of the reference distributions for respective reference lights having respective reference directivity characteristics and to store correction coefficients for respective reference distributions for removing unnecessary light contained in the reference distribution according to the incident direction of light to the detection unit, and
the calculation unit is configured to grasp an incident direction from the detection distribution, to input from the storage unit a reference distribution corresponding to a directional characteristic to be detected with the detection unit among the reference distributions and the correction coefficient corresponding to the reference distribution, to correct the reference distribution by using the correction coefficient, and subsequently to calculate the deviation.

* * * * *